(12) United States Patent
Tan et al.

(10) Patent No.: US 7,912,117 B2
(45) Date of Patent: Mar. 22, 2011

(54) TRANSPORT DELAY AND JITTER MEASUREMENTS

(75) Inventors: Kan Tan, Beaverton, OR (US); John C. Calvin, Portland, OR (US); Kalev Sepp, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 771 days.

(21) Appl. No.: 11/529,856

(22) Filed: Sep. 28, 2006

(65) Prior Publication Data

US 2008/0080605 A1   Apr. 3, 2008

(51) Int. Cl.
*H04B 3/46* (2006.01)
(52) U.S. Cl. ........................................ 375/226
(58) Field of Classification Search ........... 375/224–228
See application file for complete search history.

(56) References Cited

U.S. PATENT DOCUMENTS

| | | | | |
|---|---|---|---|---|
| 5,309,428 A * | 5/1994 | Copley et al. | | 370/245 |
| 6,931,335 B2 * | 8/2005 | Mueller | | 702/69 |
| 6,934,648 B2 * | 8/2005 | Hanai et al. | | 702/69 |
| 7,149,638 B2 * | 12/2006 | Stephens | | 702/69 |
| 7,206,368 B2 * | 4/2007 | Engel et al. | | 375/371 |
| 7,218,670 B1 * | 5/2007 | Lesea et al. | | 375/226 |
| 7,236,555 B2 * | 6/2007 | Brewer | | 375/357 |
| 7,251,764 B2 * | 7/2007 | Bonneau et al. | | 714/733 |
| 7,305,025 B2 * | 12/2007 | Yamaguchi et al. | | 375/226 |
| 7,493,223 B2 * | 2/2009 | Kayal et al. | | 702/66 |
| 7,516,030 B2 * | 4/2009 | Miller | | 702/69 |
| 2002/0097761 A1 * | 7/2002 | Sucha et al. | | 372/30 |
| 2002/0118738 A1 * | 8/2002 | Whitlock | | 375/226 |
| 2002/0163958 A1 * | 11/2002 | Yamaguchi et al. | | 375/226 |
| 2002/0176491 A1 * | 11/2002 | Kleck et al. | | 375/226 |
| 2003/0125888 A1 * | 7/2003 | Yamaguchi et al. | | 702/69 |
| 2003/0202573 A1 * | 10/2003 | Yamaguchi et al. | | 375/226 |
| 2004/0061488 A1 * | 4/2004 | Rosenbaum et al. | | 324/76.53 |
| 2004/0062301 A1 * | 4/2004 | Yamaguchi et al. | | 375/226 |
| 2004/0125873 A1 * | 7/2004 | Han | | 375/226 |
| 2005/0003785 A1 * | 1/2005 | Jackson et al. | | 455/260 |
| 2005/0031029 A1 * | 2/2005 | Yamaguchi et al. | | 375/226 |
| 2005/0163204 A1 * | 7/2005 | Brewer | | 375/224 |
| 2006/0013263 A1 * | 1/2006 | Fellman | | 370/503 |
| 2006/0018374 A1 * | 1/2006 | Nelson et al. | | 375/227 |
| 2006/0251162 A1 * | 11/2006 | Yamaguchi et al. | | 375/226 |
| 2007/0058708 A1 * | 3/2007 | Bultan et al. | | 375/226 |
| 2007/0189372 A1 * | 8/2007 | Sladoba | | 375/226 |
| 2007/0268963 A1 * | 11/2007 | Wallace et al. | | 375/226 |
| 2007/0271049 A1 * | 11/2007 | Carole et al. | | 702/67 |

* cited by examiner

*Primary Examiner* — Temesghen Ghebretinsae
(74) *Attorney, Agent, or Firm* — Francis I. Gray; Thomas F. Lenihan

(57) ABSTRACT

A method of measuring transport delay and jitter with a realtime oscilloscope using cross-correlation acquires waveforms from two test points in a system under test. Clock recovery is run on both waveforms to obtain respective rates and offsets. A time offset between the two waveforms is computed. The jitter from the two test points is filtered and a mean-removed cross-correlation coefficient is computed from the filtered jitters. A fractional delay is computed using interpolation based on LMS error, and the respective computational components are summed to compute a transport delay between the two test points. The transport delay may be used to adjust clock edges from one waveform for comparison with data transition edges of the other waveform to measure jitter.

4 Claims, 4 Drawing Sheets

TRANSPORT DELAY AND JITTER MEASUREMENTS

BACKGROUND OF THE INVENTION

The present invention relates to timing measurements, and more particularly to transport delay and jitter measurements in clock driven systems.

In clock driven systems a reference clock propagates through different paths, with the layouts of the paths introducing different delays for the reference clock. Certain circuits along the paths, such as clock data recovery (CDR) circuits, introduce additional delays. High speed chipsets used for transmitting data at multiple gigabits per second present numerous signal integrity challenges. Although a high speed backplane may seem like just a printed circuit (PC) board, it really may be viewed as a communications system. The reference clock that propagates to different parts of the backplane experiences different transport delays. System designs need to take into account the transport delays to make system performance meet requirements, such as limits to jitter.

For high speed serial data standards, such as the Peripheral Component Interface (PCI) Express and Fully Buffered Dual In-line Memory Module (FB-DIMM) standards, the physical layer may be described as shown in FIG. 1. The reference or system clock drives both a transmitter (TX) and receiver (RX) through phase locked loops (PLL) in each. The PLLs have transport delays that may be viewed as jitter transfer delays. In general the PLL characteristic has jitter transfer delay as a function of frequency. In the working frequency range a group delay is used to represent transfer delay. The transport delay of the PLL may be measured by spectrum analyzers. Transmission lines, including microstrips and striplines, also have transport delays that may be measured using Time Domain Transmissometry (TDT) or Vector Network Analyzer (VNA). For the system shown in FIG. 1 the overall transport delay is obtained by summing up the transport delays of each component, such as the PLLs and transmission lines, if the transport delay of each component is provided by component vendors. However it is very difficult, if not impossible, to use the currently available techniques (spectrum analysis, TDT, VNA) to measure directly the transport delays.

What is desired is a direct method for measuring transport delays and jitter on a high speed printed circuit board.

BRIEF BACKGROUND OF THE INVENTION

Accordingly the present invention provides a method of measuring transport delay and jitter with a realtime oscilloscope using cross-correlation. Waveforms are acquired from two test points in a system under test. Clock recovery is run on both waveforms to obtain respective rates and offsets. A time offset between the two waveforms is computed from the respective offsets. The jitter from the two test points is filtered and a mean-removed cross-correlation coefficient is computed from the filtered jitters. A fractional delay is computed using interpolation based on LMS error, and the respective computational components are summed to compute a transport delay between the two test points. The transport delay may then be used to provide an "idealized" reference clock from one of the signals for edge comparison with the other signal in order to determine jitter.

The objects, advantages and other novel features of the present invention are apparent from the following detailed description when read in conjunction with the appended claims and attached drawing.

DETAILED DESCRIPTION OF THE INVENTION

Figure 1:
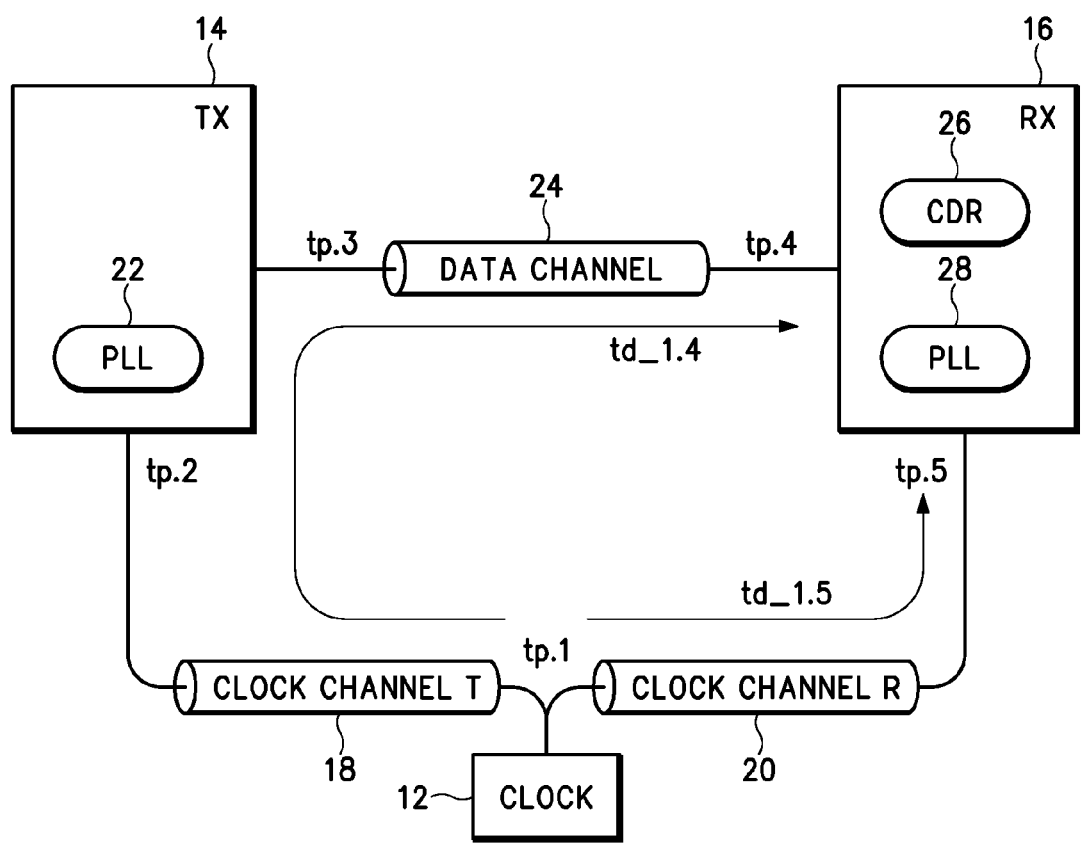
FIG. 1 is a block diagram view of a typical physical layer high speed transmission system indicating test points for transport delay and jitter measurements according to the present invention.

Referring again to FIG. 1 the reference or system clock 12 is linked to transmitter 14 and receiver 16 through respective transmission lines "channel T" 18 and "channel R" 20. The PLL 22 inside the transmitter 14 multiplies the reference clock to a data rate to drive a data bit sequence. The data from the transmitter 14 propagates to the receiver 16 through a transmission line "data channel" 24. A path from "tp.1" to "tp.4" includes two channels 18, 24 and the PLL 22. These three components all have lowpass filtering characteristics. Therefore low frequency jitter measured at "tp.1" and at "tp.4" are correlated. When two signals are correlated, the delay between these two signals is the value that makes a cross-correlation coefficient between the two signals peak. When the cross-correlation coefficient peaks, the delay value is optimal in the sense of least mean squared (LMS) error. The transport delay Td_1.4 is measured between "tp.1" and "tp.4" by computing the cross-correlation coefficient between the low frequency jitter components at the two points. The cross-correlation method provides a resolution only to one unit interval (UI). Finer resolution may be achieved by interpolation to achieve the optimal value in the sense of LMS error.

Figure 2:
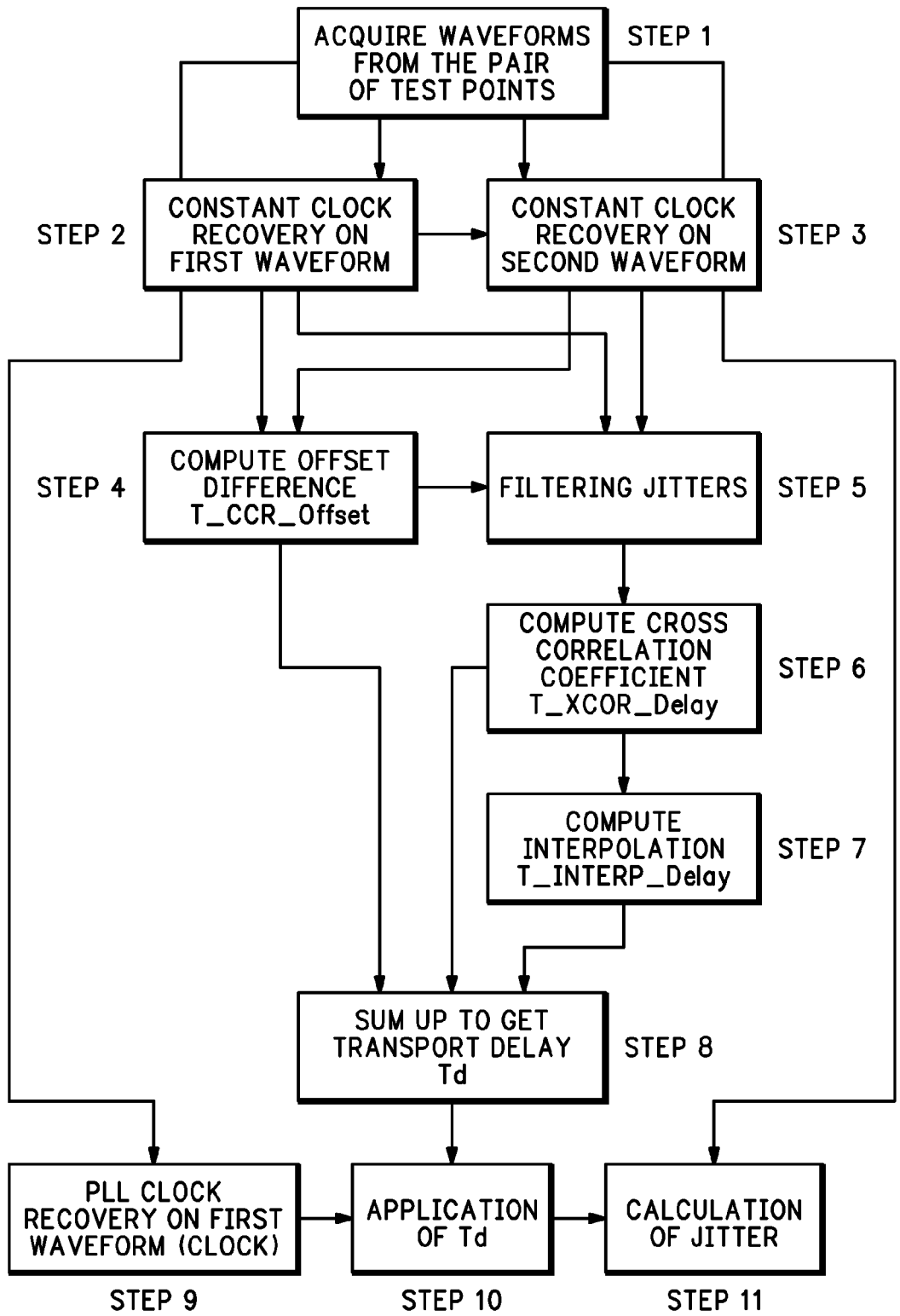
FIG. 2 is a flow diagram view of a transport delay measurement procedure according to the present invention.

The procedure of measuring transport delay and jitter is shown in FIG. 2.

Step 1: Acquire waveforms at two test points using an appropriate instrument, such as a realtime oscilloscope. The oscilloscope channels need to be de-skewed and the probes are included in the de-skew when they are used.

Step 2: Run constant clock recovery (CCR) on one waveform, i.e., "tp.1", to get clock rate and offset T_CCR_offset_tp.1. The clock rate is then multiplied to get the data rate. For example the multiplication factor for the PCI-Express standard may be 25.

Step 3: Run CCR on the other waveform, i.e., data waveform at "tp.4", using the data rate to get the offset T_CCR_Offset_tp.4. The algorithm assures that the data rate in Steps 2 and 3 are exactly the same —bit rate found in Step 2 (multiplied as necessary to convert to data rate) is used for the bit rate of the data in Step 3.

Step 4: Compute the time offset between recovered clocks from the two waveforms $$T\_CCR\_Offset = T\_CCR\_Offset\_tp.4 - T\_CCR\_Offset\_tp.1$$

Represented in UIs.

Step 5: Filter jitter from the two test points. Multiply clock rate as needed and interpolate data jitter as needed for filtering. The filtering may be in any form depending on what jitter is common between the signals at the two points. In this example the low frequency jitter is common at the two points so a lowpass filter is used. For the PCI-Express standard the cutoff frequency may be set to 2 MHz.

Step 6: Compute a means-removed cross-correlation coefficient between the filtered jitter from the two points. Find the maximum delay that yields a maximum value for the cross-correlation coefficient T_XCOR-delay, in UIs. When doing the cross-correlation computation the range of the delay needs to be specified, which is easy to determine.

Step 7: Compute a fractional delay, T_INTERP_Delay, using interpolation based on the LMS error method to achieve a resolution finer than one UI.

Step 8: Compute the transport delay by summing up the components obtained above:

$$Td = T\_CCR\_Offset + T\_XCOR\_Delay + T\_INTERP\_Delay$$

The result is in UIs, which may be converted to seconds since the duration of the UI is known.

The cross-correlation based transport delay method described above may be applied to measure transport delay or difference of delays between any two points in the system. For example the difference of transport delays between "tp.4" and "tp.5" may be directly measured. The signals at the two points may be either clock or data signals, i.e., from "tp.1" to "tp.5" is from clock to clock and from "tp.3" to "tp.4" is from data to data. To get the measurement results with high accuracy the signal-to-noise ratio (SNR) should be high enough, which is true in this example since the low frequency jitter component is the signal as is often the case in high speed data transmission systems. For example spread spectrum clocking (SSC) is widely used in reference clocks and has large low frequency jitter.

In a clock data recovery (CDR) system that has both clock and data as inputs, such as the CDR 26 in the receiver 16 which has data and a reference clock output from the PLL 28 as inputs, the PLL is a clock multiplier and has a characteristic of low passing the jitter from the input reference clock. The CDR 26 figures out the optimal delay between its recovered clock and data, which determines the data buffer size. The cross-correlation procedure described for transport delay computation may be applied to find the optimal delay between the data and recovered clock.

After the optimal delay is obtained as shown in FIG. 2, the binding between data crossing edges and recovered clock crossing edges may be established by generating recovered clock edges from the reference clock waveform using a PLL (Step 9). The clock edges are adjusted using the optimal delay, $T_d$, (Step 10) to produce "ideal" clock edges. Likewise the jitter measurement is computed straightforwardly (Step 11) as the difference between data edge crossing times and the "ideal" clock edge crossing times.

Figure 3:
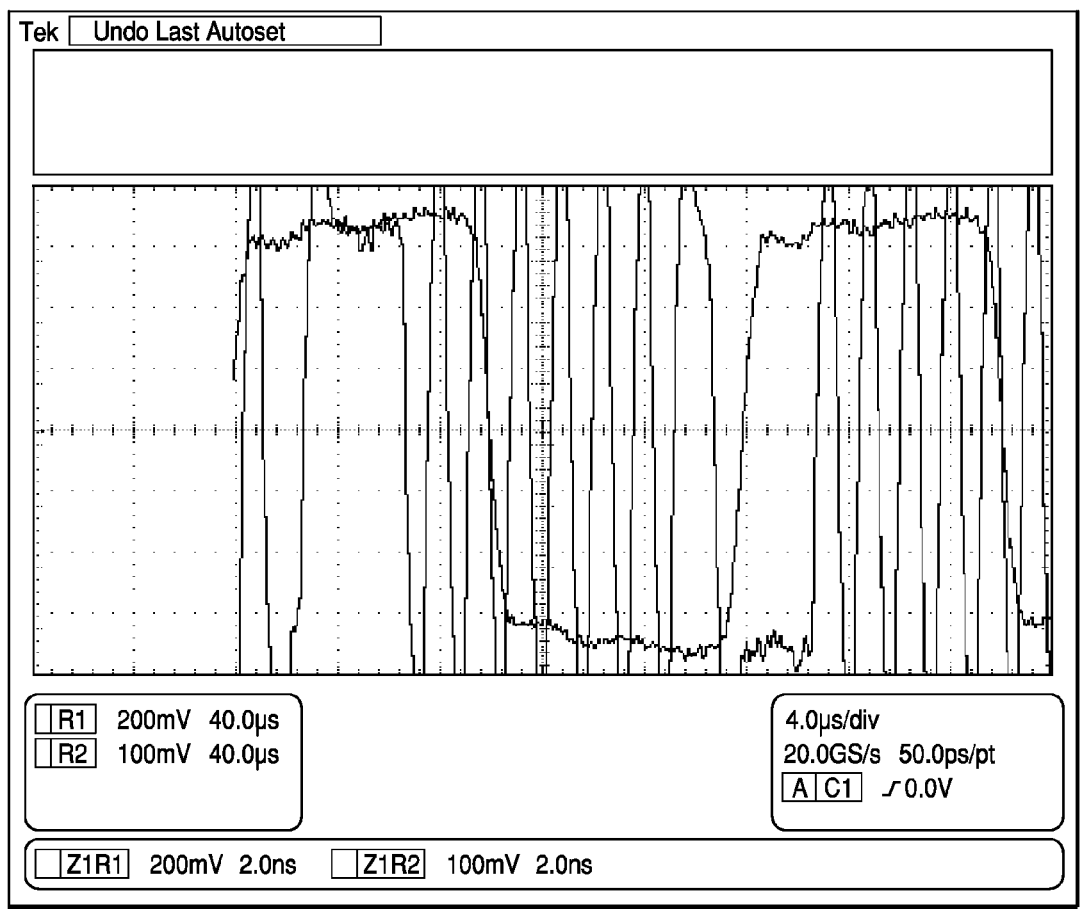
FIG. 3 is a graphic view of clock and data waveforms from a PCI-Express system corresponding to FIG. 1.

As an example the clock and data waveforms are shown in FIG. 3 for a PCI-Express system. The intermediate and final results from the transport delay measurement procedure are:

$$T\_CCR\_Offset = -24.416 \text{ (UI)}$$

$$T\_XCOR\_Delay = 28 \text{ (UI)}$$

$$T\_INTERP\_Delay = -0.0007 \text{ (UI)}$$

$$Td = 3.5769 \text{ (UI) or } 1.4308 \text{ (ns)}$$

The data rate is 25 times the reference clock rate in this PCI-Express system and the first intermediate result, T_CCR_Offset, is about −24 UI, which means that the first recovered data edge is about 24 UI ahead of the first recovered clock edge. This is consistent with the observation from FIG. 3.

Figure 4:
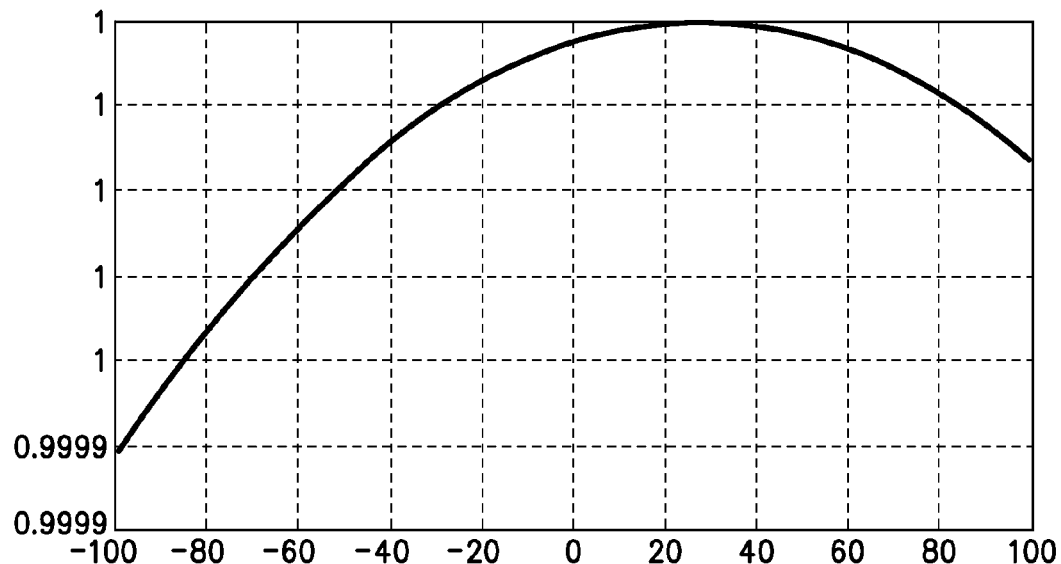
FIG. 4 is a graphic view of a cross-correlation between filtered jitters according to the present invention.

The second intermediate result, T_XCORR_Delay, is obtained from the cross-correlation curve shown in FIG. 4. The fractional value of the third intermediate result, T_INTERP_Delay, provides finer resolution. The final result, Td, is the transport delay.

In Step 6 the cross-correlation between two signals is computed. When assuming the two signals, x(n) and y(n), n=1, 2, . . . , N, are correlated, there is an optimal integer delay, k, such that the signal x(n) and delayed signal y(n+k) have minimum difference. The good criterion of difference is squared difference or error. Since N is a constant number, minimizing on mean squared error is the same as minimizing squared error. So the solution of delay for LMS error is the same as the solution for least square error here.

$$\min_k J(k) = \min_k \left\{ \sum_n (x(n) - y(n+k))^2 \right\} =$$

$$\sum_n x(n)^2 + \sum_n y(n)^2 - 2\max_k \left\{ \sum_n (x(n)^* y(n+k)) \right\} =$$

$$\|x\|^2 + \|y\|^2 - 2\|x\|\|y\|\max_k r(k)$$

where r(k) is the cross correlation coefficient, $\|x\|$ and $\|y\|$ are 2-norm of x(n) and y(n), n=1, 2, . . . , N. When x(n) and y(n) are normalized, $\|x\|$ and $\|y\|$ are both equal to one. Since $\|x\|$ and $\|y\|$ are constant, a particular k that maximizes the cross correlation coefficient also minimizes the squared error in the mean time.

Figure 5:
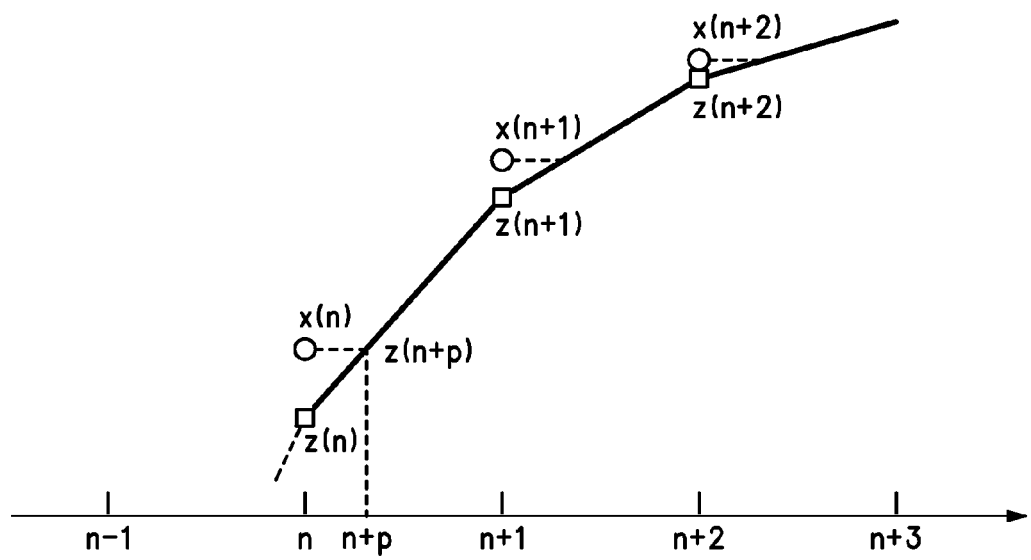
FIG. 5 is a graphic view for computing delay from interpolation according to the present invention.

Step 7 computes the fractional delay using interpolation, as illustrated in FIG. 5, where x(n) and z(n) are correlated. There is an optimal fractional delay between the signal x(n) and the shifted signal z(n+p) that gives the minimum error, where p is a fraction number which has a unit of UI and z(n+p) is the interpolation value between z(n) and z(n+1):

$$z(n+p) = (1-p)^* z(n) + p^* z(n+1)$$

The good optimization criterion is squared error or, equivalently, mean squared error when N is constant.

$$\min_p J(p) = \min_p \{\Sigma_n (x(n) - z(n+p))^2\} =$$
$$\min_p \{\Sigma_n (x(n) - z(n) - (z(n+1) - z(n))^* p)^2\}$$

The solution to this optimization problem is obtained by taking a partial derivative on variable p:

$$p = \{\Sigma_n (x(n) - z(n))^* (z(n+1) - z(n))\} / \{\Sigma_n (z(n+1) - z(n))^2\}$$

Thus the present invention provides a method of transport delay and jitter measurements effectively using realtime oscilloscopes that is based on cross-correlation.

What is claimed is:

1. A method of measurements comprising the steps of:
   acquiring waveforms at two test points of a system under test;
   running constant clock recovery on both waveforms to obtain respective offset values;
   computing a time offset between the respective offset values;
   filtering jitter from the two test points;
   computing a mean-removed cross-correlation coefficient between the filtered jitter from the two test points;
   computing a fractional delay; and
   computing a transport delay by summing the time offset, fractional delay, and mean-removed cross-correlation coefficient.

2. The method as recited in claim 1 wherein the fractional delay computing step comprises the step of using interpolation based on a least mean squared error method.

3. The method as recited in claim 1 wherein the running step comprises the steps of:
   obtaining a reference clock rate from one of the waveforms; and
   multiplying the reference clock rate by a constant to obtain a data rate, the data rate being used in the running step for the other waveform.

4. The method as recited in claim 3 further comprising the steps of:
   determining reference clock edges from one of the waveforms;
   delaying the reference clock edges by the transport delay to obtain "ideal" clock edges;
   determining data transition edges from the other of the waveforms; and
   computing jitter as a function of the "ideal" clock edges and the data transition edges.

* * * * *